United States Patent
Kwon et al.

(10) Patent No.: US 10,068,633 B2
(45) Date of Patent: Sep. 4, 2018

(54) SEMICONDUCTOR DEVICES AND INTEGRATED CIRCUITS INCLUDING THE SAME

(71) Applicant: SK hynix Inc., Icheon-si, Gyeonggi-do (KR)

(72) Inventors: Kihun Kwon, Yongin-si (KR); Jaeil Kim, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/662,525

(22) Filed: Jul. 28, 2017

(65) Prior Publication Data

US 2018/0040361 A1 Feb. 8, 2018

(30) Foreign Application Priority Data

Aug. 2, 2016 (KR) ........................ 10-2016-0098425
May 19, 2017 (KR) ........................ 10-2017-0062099

(51) Int. Cl.
| | |
|---|---|
| *G11C 11/40* | (2006.01) |
| *G11C 11/4074* | (2006.01) |
| *G11C 11/406* | (2006.01) |
| *G11C 11/4076* | (2006.01) |
| *G11C 11/4093* | (2006.01) |

(Continued)

(52) U.S. Cl.
CPC ............ *G11C 11/4074* (2013.01); *G11C 7/22* (2013.01); *G11C 11/406* (2013.01); *G11C 11/4076* (2013.01); *G11C 11/4093* (2013.01); *G11C 29/023* (2013.01); *G11C 2207/2227* (2013.01); *G11C 2211/4067* (2013.01)

(58) Field of Classification Search
CPC ..... G11C 7/22; G11C 11/406; G11C 11/4074; G11C 11/4076; G11C 11/4093; G11C 29/023
USPC .................................. 365/193, 206, 227, 228
See application file for complete search history.

(56) References Cited

U.S. PATENT DOCUMENTS

| | | | | |
|---|---|---|---|---|
| 8,610,460 B2* | 12/2013 | Kang | ................... | G11C 7/1045 326/30 |
| 8,896,340 B2* | 11/2014 | Kang | ................. | H03K 19/0005 326/30 |
| 2006/0245287 A1 | 11/2006 | Seitz et al. | | |

(Continued)

FOREIGN PATENT DOCUMENTS

| | | |
|---|---|---|
| KR | 101065336 B1 | 9/2011 |
| KR | 1020150095494 A | 8/2015 |

*Primary Examiner* — Tan T. Nguyen
(74) *Attorney, Agent, or Firm* — William Park & Associates Ltd.

(57) ABSTRACT

An integrated circuit may include a first semiconductor device and a second semiconductor device. The first semiconductor device may be configured to output a chip section signal and command/address signals. The second semiconductor device may be configured to enter a power-down operation based on the chip section signal and the command/address signals. The second semiconductor device may be configured to interrupt input of a first group of the command/address signals during the power-down operation. The second semiconductor device may be configured to selectively perform an on-die termination (ODT) operation according to a level combination of a second group of the command/address signals.

23 Claims, 12 Drawing Sheets

(51) Int. Cl.
 *G11C 7/22* (2006.01)
 *G11C 29/02* (2006.01)

(56) References Cited

U.S. PATENT DOCUMENTS

| | | | |
|---|---|---|---|
| 2009/0273960 A1* | 11/2009 | Kim | G11C 7/1048 365/51 |
| 2009/0303802 A1* | 12/2009 | Lee | G11C 5/04 365/189.05 |
| 2010/0027356 A1* | 2/2010 | Shaeffer | G11C 5/063 365/191 |
| 2010/0208534 A1 | 8/2010 | Fujisawa | |
| 2015/0279444 A1* | 10/2015 | Vergis | G11C 7/1057 711/105 |
| 2015/0348612 A1* | 12/2015 | Shaeffer | G11C 7/1072 365/191 |
| 2017/0092379 A1* | 3/2017 | Kim | G06F 3/0613 |

* cited by examiner

FIG. 11

| | CA<1> | CA<2> | CA<3> | CA<4> | CA<5> | CA<6> | CA<7> |
|---|---|---|---|---|---|---|---|
| WRITE OPERATION | X | X | X | L | L | H | H |
| READ OPERATION | X | X | X | L | H | H | H |
| MODE REGISTER READ OPERATION | X | X | X | L | H | H | H |
| POWER-DOWN ENTRY | X | X | X | H | L | H | H |
| POWER-DOWN END | X | X | X | H | H | H | H |

SEMICONDUCTOR DEVICES AND INTEGRATED CIRCUITS INCLUDING THE SAME

CROSS-REFERENCE TO RELATED APPLICATIONS

The present application claims priority under 35 U.S.C 119(a) to Korean Application No. 10-2016-0098425, filed on Aug. 2, 2016 and Korean Application No. 10-2017-0062099, filed on May 19, 2017, which are incorporated herein by reference in its entirety.

BACKGROUND

1. Technical Field

Embodiments of the present disclosure may generally relate to integrated circuits and, more particularly, to semiconductor devices, a power-down operation, and an on-die termination operation.

2. Related Art

Semiconductor devices, for example, dynamic random access memory (DRAM) devices may be designed to operate at a high speeds with low power consumption and large cell capacitance. Thus, most semiconductor devices may be designed to have a power-down mode for minimizing a driving current when a data input/output (I/O) operation is not performed. If the semiconductor devices are in the power-down mode, the semiconductor devices may terminate generation of internal voltages for driving internal circuits of the semiconductor devices.

As a swing width of transmission signals corresponding to interfacial signals between semiconductor devices included in a semiconductor system is gradually reduced to improve an operation speed of the semiconductor system, reflection of the transmission signals has severely occurred due to impedance mismatch at interface stages between the semiconductor devices. Thus, an impedance matching circuit (also, referred to as "on-die termination circuit") has been used in semiconductor systems to suppress the reflection of the transmission signals.

SUMMARY

According to an embodiment, an integrated circuit may be provided. The integrated circuit may include a first semiconductor device and a second semiconductor device. The first semiconductor device may be configured to output a chip section signal and command/address signals. The second semiconductor device may enter a power-down operation based on the chip section signal and the command/address signals. In addition, the second semiconductor device may be configured to interrupt input of a first group of the command and address (command/address) signals during the power-down operation. The second semiconductor device may selectively perform an on-die termination (ODT) operation according to a level combination of a second group of the command/address signals.

According to an embodiment, an integrated circuit may be provided. The integrated circuit may include a first semiconductor device and second semiconductor device. The first semiconductor device may be configured to output first and second chip selection signals and command/address signals. The second semiconductor device may include a first rank and a second rank. The first rank may perform an on-die termination (ODT) operation according to a level combination of a first group of the command/address signals based on the first chip selection signal, and the second rank may perform a normal operation according to a level combination of the first group of the command/address signals based on the second chip selection signal.

According to an embodiment, an integrated circuit may be provided. The integrated circuit may include a semiconductor device configured to include at least two ranks, and to receive command and address (command/address) signals. The ranks may selectively perform an on-die termination (ODT) operation or a normal operation during a power-down operation according to a level combination of the command/address signals.

According to an embodiment, a semiconductor device may be provided. The semiconductor device may include a plurality of ranks configured to receive command and address (command/address) signals and selectively perform an on-die termination (ODT) operation or a normal operation during a power-down operation according to a level combination of the command/address signals.

BRIEF DESCRIPTION OF THE DRAWINGS

FIG. 11 is a table illustrating an operation of the command generation circuit illustrated in FIG. 10.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to integrated circuits selectively performing an on-die termination operation during a power-down operation.

Further, the logic levels of the signals may be different from or the opposite of those described. For example, a signal described as having a logic "high" level may alternatively have a logic "low" level, and a signal described as having a logic "low" level may alternatively have a logic "high" level.

For reference, an embodiment including additional components may be provided. Furthermore, an logic high or logic low configuration indicating an active state of a signal or circuit may be changed depending on embodiments. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

For reference, an embodiment including additional components may be provided. Furthermore, an logic high or logic low configuration indicating an active state of a signal or circuit may be changed depending on embodiments. Furthermore, the configuration of a transistor required for implementing the same function may be modified. That is, the configuration of the PMOS transistor and the configuration of the NMOS transistor may be replaced with each other, depending on a specific situation. If necessary, various transistors may be applied to implement the configurations.

Figure 1:
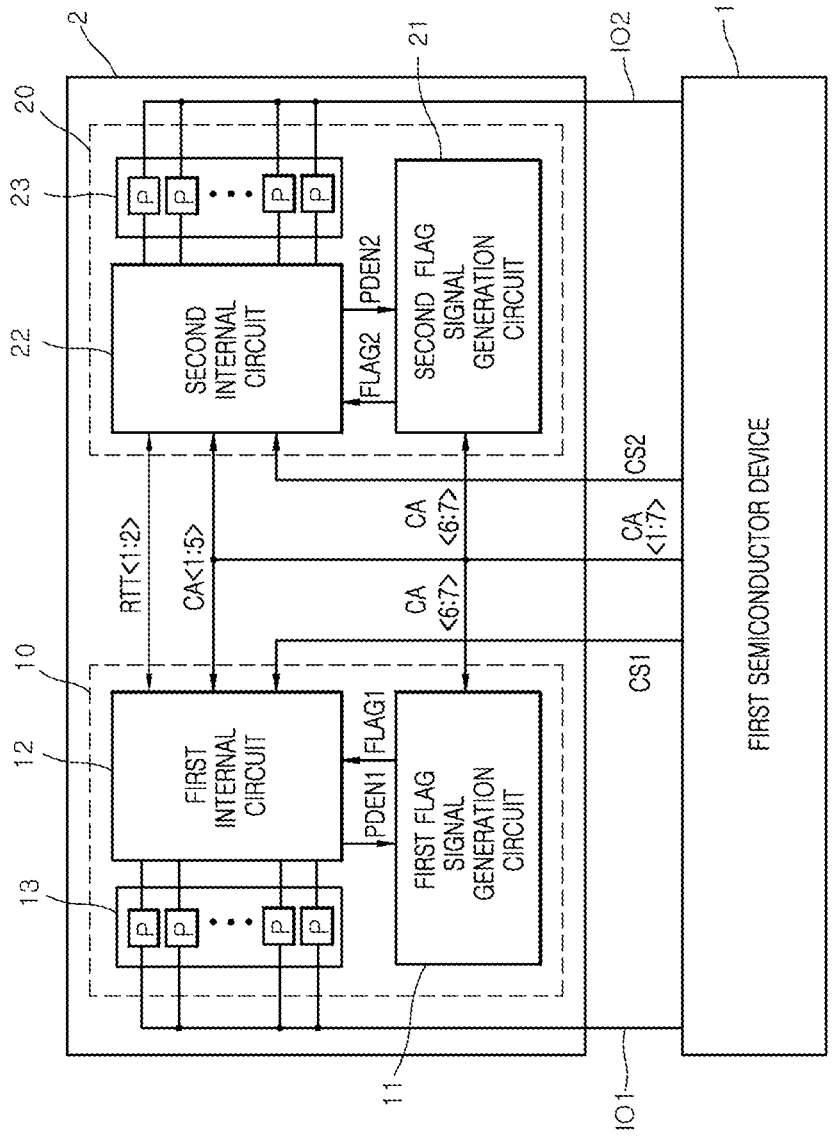
FIG. 1 is a block diagram illustrating a configuration of an integrated circuit according to an embodiment of the present disclosure.

Referring to FIG. 1, an integrated circuit according to an embodiment may include a first semiconductor device 1 and a second semiconductor device 2. The second semiconductor device 2 may include a first rank 10 and a second rank 20.

The first semiconductor device 1 may output a first chip selection signal CS1 and a second chip selection signal CS2. The first chip selection signal CS1 may be set as a signal for selecting the first rank 10 included in the second semiconductor device 2. The second chip selection signal CS2 may be set as a signal for selecting the second rank 20 included in the second semiconductor device 2. The first semiconductor device 1 may output first to seventh command and address (command/address) signals CA<1:7>. The first to seventh command/address signals CA<1:7> may include a command and an address for controlling an operation of the second semiconductor device 2. The first to seventh command/address signals CA<1:7> may be transmitted through lines that transmit at least one group of addresses, commands and data. Although FIG. 1 illustrates an example in which the first semiconductor device 1 outputs the first to seventh command/address signals CA<1:7> including seven bits, the present disclosure is not limited thereto. For example, the number of bits included in the command/address signals outputted from the first semiconductor device 1 may be set to be less than or greater than seven according to the embodiments. The first semiconductor device 1 may receive or output clock signals, data, and other signals through a first input and output (input/output) (I/O) line IO1 and a second I/O line IO2.

The first rank 10 may include a first flag signal generation circuit 11, a first internal circuit 12, and a first pad circuit 13.

The first flag signal generation circuit 11 may generate a first flag signal FLAG1 which is enabled if the sixth and seventh command/address signals CA<6:7> have a predetermined level combination, in response to a first power-down signal PDEN1. The first flag signal generation circuit 11 may generate the first flag signal FLAG1 which is enabled if the first power-down signal PDEN1 is enabled and the sixth and seventh command/address signals CA<6:7> have a level combination of 'H,H' (i.e., High, High).

The first internal circuit 12 may enter a power-down operation (i.e., a power-down mode) in response to the first chip selection signal CS1 and the first flag signal FLAG1. The first internal circuit 12 may interrupt the input of the first to third command/address signals CA<1:3> included in the first to seventh command/address signals CA<1:7> during the power-down operation. The first internal circuit 12 may perform an on-die termination (ODT) operation to drive levels of pads P included in the first pad circuit 13 so that an equivalent resistance value at each of the pads P included in the first pad circuit 13 exhibits a predetermined resistance value, according to a level combination of the fourth and fifth command/address signals CA<4:5> included in the first to seventh command/address signals CA<1:7>. The first internal circuit 12 may generate the first power-down signal PDEN1 according to a level combination of the fourth and fifth command/address signals CA<4:5> included in the first to seventh command/address signals CA<1:7>. The first internal circuit 12 may perform a normal operation including a write operation and a read operation in response to the first chip selection signal CS1 and the first flag signal FLAG1. The first internal circuit 12 may perform the write operation or the read operation to receive or output the data through the pads P, according to a level combination of the first to fifth command/address signals CA<1:5> included in the first to seventh command/address signals CA<1:7>. The first to third command/address signals CA<1:3> may be set as a first group of the first to seventh command/address signals CA<1:7>. The fourth and fifth command/address signals CA<4:5> may be set as a second group of the first to seventh command/address signals CA<1:7>. The sixth and seventh command/address signals CA<6:7> may be set as a third group of the first to seventh command/address signals CA<1:7>. The first internal circuit 12 may control a drivability for driving the pads P included in the first pad circuit 13 according to a first resistance signal RTT<1>. The first internal circuit 12 may control a drivability for driving the pads P included in the first pad circuit 13 according to a second resistance signal RTT<2> outputted from the second rank 20.

The first pad circuit 13 may include the plurality of pads P.

Figure 9:
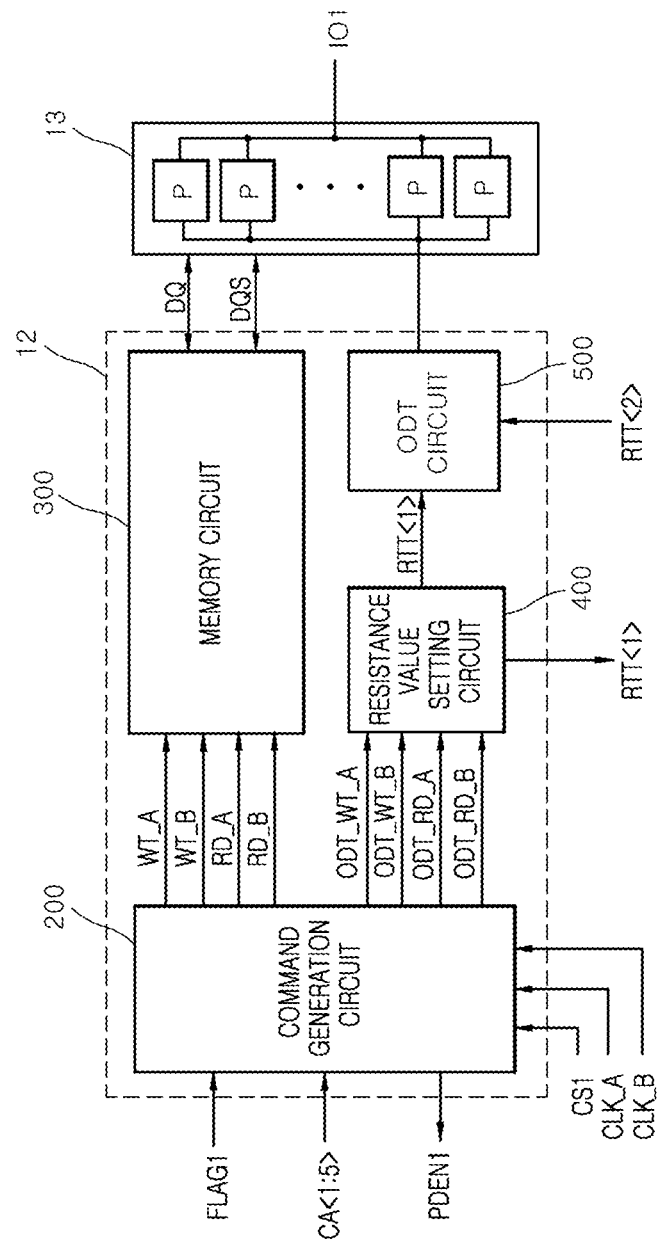
FIG. 9 is a block diagram illustrating a configuration of a first internal circuit and a first pad circuit included in the integrated circuit of FIG. 1.

The plurality of pads P may be coupled to the first I/O line IO1 to receive or output the clock signals, the data and the other signals. The plurality of pads P may be coupled to a memory circuit 300 in the first internal circuit 12, as illustrated in FIG. 9. The plurality of pads P may also be coupled to an ODT circuit 500 in the first internal circuit 12, as illustrated in FIG. 9. The number of the pads P included in the first pad circuit 13 may be set to be different according to the embodiments.

The first rank 10 may drive levels of the pads P included in the first pad circuit 13 according to the first or second resistance signal RTT<1> or RTT<2> to prevent the signals loaded on the first I/O line IO1 from being reflected and distorted. As a result, the reliability of the signals may be improved.

The second rank 20 may include a second flag signal generation circuit 21, a second internal circuit 22, and a second pad circuit 23.

The second flag signal generation circuit 21 may generate a second flag signal FLAG2 which is enabled if the sixth and seventh command/address signals CA<6:7> have a predetermined level combination, in response to a second power-down signal PDEN2. The second flag signal generation circuit 21 may generate the second flag signal FLAG2 which is enabled if the second power-down signal PDEN2 is enabled and the sixth and seventh command/address signals CA<6:7> have a level combination of 'H,H'.

The second internal circuit 22 may enter the power-down operation (i.e., the power-down mode) in response to the second chip selection signal CS2 and the second flag signal FLAG2. The second internal circuit 22 may interrupt the input of the first to third command/address signals CA<1:3> included in the first to seventh command/address signals CA<1:7> during the power-down operation. The second internal circuit 22 may perform the on-die termination (ODT) operation to drive levels of pads P included in the second pad circuit 23 so that an equivalent resistance value at each of the pads P included in the second pad circuit 23 exhibits a predetermined resistance value, according to a level combination of the fourth and fifth command/address signals CA<4:5> included in the first to seventh command/address signals CA<1:7>. The second internal circuit 22 may generate the second power-down signal PDEN2 according to a level combination of the fourth and fifth command/address signals CA<4:5> included in the first to seventh command/address signals CA<1:7>. The second internal circuit 22 may perform the normal operation in response to the second chip selection signal CS2 and the second flag signal FLAG2. The second internal circuit 22 may perform the write operation or the read operation to receive or output the data through the pads P, according to a level combination of the first to fifth command/address signals CA<1:5> included in the first to seventh command/address signals CA<1:7>. The second internal circuit 22 may control a drivability for driving the pads P included in the second pad circuit 23 according to the second resistance signal RTT<2>. The second internal circuit 22 may control a drivability for driving the pads P included in the second pad circuit 23 according to the first resistance signal RTT<1> outputted from the first rank 10.

The second pad circuit 23 may include the plurality of pads P.

The plurality of pads P may be coupled to the second I/O line IO2 to receive or output the clock signals, the data and the other signals. The plurality of pads P may be coupled to a memory circuit (not illustrated) included in the second internal circuit 22. The plurality of pads P may also be coupled to an ODT circuit (not illustrated) included in the second internal circuit 22. The number of the pads P included in the second pad circuit 23 may be set to be different according to the embodiments.

The second rank 20 may drive levels of the pads P included in the second pad circuit 23 according to the first or second resistance signal RTT<1> or RTT<2> to prevent the signals loaded on the second I/O line IO2 from being reflected and distorted. As a result, the reliability of the signals may be improved.

The pads P of the first pad circuit 13 may be coupled to the first semiconductor device 1 through the first I/O line IO1, and the pads P of the second pad circuit 23 may be coupled to the first semiconductor device 1 through the second I/O line IO2. Alternatively, the first and second ranks 10 and 20 may share a single pad circuit (not illustrated) instead of the first and second pad circuits 13 and 23, and pads included in the single pad circuit may be coupled to the first semiconductor device 1 through an I/O line. The first to seventh command/address signals CA<1:7> may be inputted to the second semiconductor device 2 through command/address pads other than the pads P of the first and second pad circuits 13 and 23.

Each of the first and second ranks 10 and 20 may be configured to receive the first to seventh command/address signals CA<1:7>.

Figure 2:
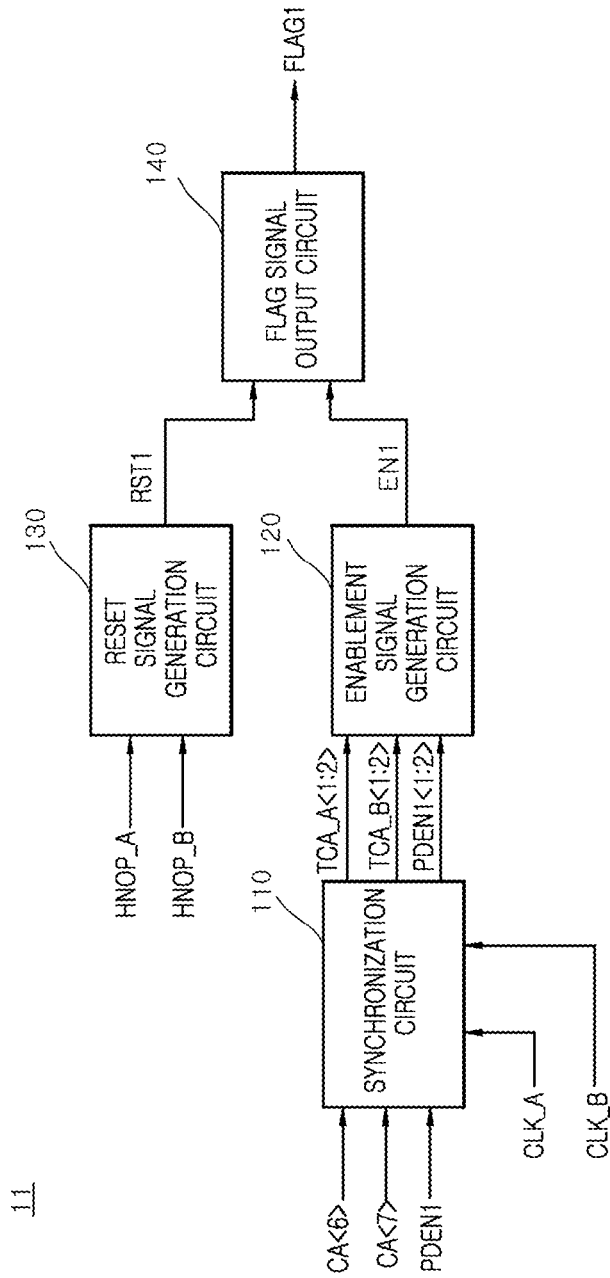
FIG. 2 is a block diagram illustrating an example of a first flag signal generation circuit included in the integrated circuit of FIG. 1.

Referring to FIG. 2, the first flag signal generation circuit 11 may include a synchronization circuit 110, an enablement signal generation circuit 120, a reset signal generation circuit 130 and a flag signal output circuit 140.

The synchronization circuit 110 may be synchronized with a first clock signal CLK_A to output the third group of command/address signals CA<6:7> as first and second transmitted command/address signals TCA_A<1:2>. The synchronization circuit 110 may be synchronized with a rising edge of the first clock signal CLK_A to output the third group of command/address signals CA<6:7> as the first and second transmitted command/address signals TCA_A<1:2>. The synchronization circuit 110 may be synchronized with a second clock signal CLK_B to output the third group of command/address signals CA<6:7> as third and fourth transmitted command/address signals TCA_B<1:2>. The synchronization circuit 110 may be synchronized with a rising edge of the second clock signal CLK_B to output the third group of command/address signals CA<6:7> as the third and fourth transmitted command/address signals TCA_B<1:2>. The synchronization circuit 110 may be synchronized with the first clock signal CLK_A to output the first power-down signal PDEN1 as a first transmitted power-down signal PDEN1<1>. The synchronization circuit 110 may be synchronized with a rising edge of the first clock signal CLK_A to output the first power-down signal PDEN1 as the first transmitted power-down signal PDEN1<1>. The synchronization circuit 110 may be synchronized with the second clock signal CLK_B to output the first power-down signal PDEN1 as a second transmitted power-down signal PDEN1<2>. The synchronization circuit 110 may be synchronized with a rising edge of the second clock signal CLK_B to output the first power-down signal PDEN1 as the second transmitted power-down signal PDEN1<2>. The first and second clock signals CLK_A and CLK_B may be signals that are generated by dividing a frequency of an external clock signal (provided by an external device or an external system) to synchronize the first and second semiconductor devices 1 and 2. Each of the first and second clock signals CLK_A and CLK_B may be a signal which is periodically toggled. The first clock signal CLK_A may be set to have a phase which is opposite to a phase of the second clock signal CLK_B.

The enablement signal generation circuit 120 may generate a first enablement signal EN1 which is enabled if the first and second transmitted command/address signals TCA_A<1:2> have a first level combination, in response to the first transmitted power-down signal PDEN1<1>. The enablement signal generation circuit 120 may generate the first enablement signal EN1 which is enabled if the first and second transmitted command/address signals TCA_A<1:2> have a first level combination and the first transmitted power-down signal PDEN1<1> is enabled. The enablement signal generation circuit 120 may generate the first enablement signal EN1 which is enabled if the third and fourth transmitted command/address signals TCA_B<1:2> have a first level combination, in response to the second transmitted power-down signal PDEN1<2>. The enablement signal generation circuit 120 may generate the first enablement signal EN1 which is enabled if the third and fourth transmitted command/address signals TCA_B<1:2> have a first level combination and the second transmitted power-down signal PDEN1<2> is enabled. The first level combination of the first and second transmitted command/address signals TCA_A<1:2> means that the first transmitted command/address signal TCA_A<1> has a logic "high(H)" level and the second transmitted command/address signal TCA_A<2> has a logic "high(H)" level. The first level combination of the third and fourth transmitted command/address signals TCA_B<1:2> means that the third transmitted command/address signal TCA_B<1> has a logic "high(H)" level and the fourth transmitted command/address signal TCA_B<2> has a logic "high(H)" level.

The reset signal generation circuit 130 may generate a first reset signal RST1 which is enabled in response to a first power-down end signal HNOP_A. The reset signal generation circuit 130 may generate the first reset signal RST1 which is enabled in response to a second power-down end signal HNOP_B. The reset signal generation circuit 130 may generate the first reset signal RST1 which is enabled if the first power-down end signal HNOP_A or the second power-down end signal HNOP_B is enabled.

The flag signal output circuit 140 may generate the first flag signal FLAG1 which is enabled in response to the first enablement signal EN1 and which is disabled in response to the first reset signal RST1.

The second flag signal generation circuit 21 may be realized to have substantially the same configuration as the first flag signal generation circuit 11 illustrated in FIG. 2. Thus, a detailed description of a configuration and an operation of the second flag signal generation circuit 21 will be omitted hereinafter.

Figure 3:
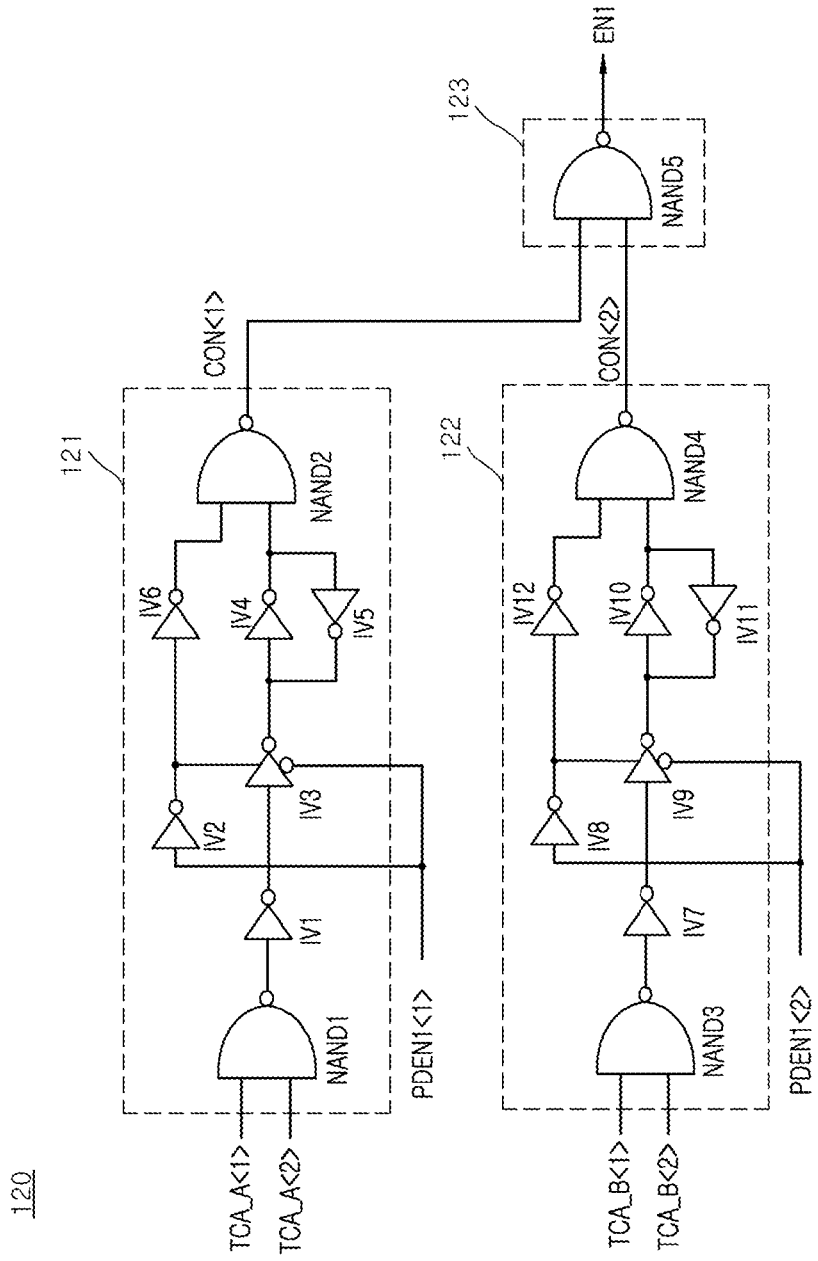
FIG. 3 is a circuit diagram illustrating an example of an enablement signal generation circuit included in the first flag signal generation circuit of FIG. 2.

Referring to FIG. 3, the enablement signal generation circuit 120 may include a first control signal generation circuit 121, a second control signal generation circuit 122, and a logic circuit 123.

The first control signal generation circuit 121 may be realized using logic operators, for example but not limited to, NAND gates NAND1 and NAND2 and inverters IV1, IV2, IV3, IV4, IV5, and IV6. The first control signal generation circuit 121 may generate a first control signal CON1 which is enabled to have a logic "low(L)" level if the first and second transmitted command/address signals TCA_A<1:2> have a first level combination, in response to the first transmitted power-down signal PDEN1<1>. The first control signal generation circuit 121 may generate the first control signal CON1 which is enabled to have a logic "low(L)" level if a level of the first transmitted power-down signal PDEN1<1> is changed from a logic "low(L)" level into a logic "high(H)" level and the first and second transmitted command/address signals TCA_A<1:2> have a first level combination. The first level combination of the first and second transmitted command/address signals TCA_A<1:2> means that the first transmitted command/address signal TCA_A<1> has a logic "high(H)" level and the second transmitted command/address signal TCA_A<2> has a logic "high(H)" level.

The second control signal generation circuit 122 may be realized using logic operators, for example but not limited to, NAND gates NAND3 and NAND4 and inverters IV7, IV8, IV9, IV10, IV11 and IV12. The second control signal generation circuit 122 may generate a second control signal CON2 which is enabled to have a logic "low(L)" level if the third and fourth transmitted command/address signals TCA_B<1:2> have a first level combination, in response to the second transmitted power-down signal PDEN1<2>. The second control signal generation circuit 122 may generate the second control signal CON2 which is enabled to have a logic "low(L)" level if a level of the second transmitted power-down signal PDEN1<2> is changed from a logic "low(L)" level into a logic "high(H)" level and the third and fourth transmitted command/address signals TCA_B<1:2> have a first level combination. The first level combination of the third and fourth transmitted command/address signals TCA_B<1:2> means that the third transmitted command/address signal TCA_B<1> has a logic "high(H)" level and the fourth transmitted command/address signal TCA_B<2> has a logic "high(H)" level.

The logic circuit 123 may be realized using a logic operator, for example but not limited to, a NAND gate NAND5. The logic circuit 123 may generate the first enablement signal EN1 in response to the first and second control signals CON1 and CON2. The logic circuit 123 may perform a NAND operation of the first and second control signals CON1 and CON2 to generate the first enablement signal EN1. The logic circuit 123 may generate the first enablement signal EN1 which is enabled to have a logic "high(H)" level if at least one of the first and second control signals CON1 and CON2 is enabled to have a logic "low(L)" level.

The enablement signal generation circuit 120 having an aforementioned configuration may generate the first enablement signal EN1 which is enabled if the first and second transmitted command/address signals TCA_A<1:2> generated from the sixth and seventh command/address signals CA<6:7> in synchronization with the first clock signal CLK_A have a first level combination, in response to the first transmitted power-down signal PDEN1<1>. The enablement signal generation circuit 120 may generate the first enablement signal EN1 which is enabled if the third and fourth transmitted command/address signals TCA_B<1:2> generated from the sixth and seventh command/address signals CA<6:7> in synchronization with the second clock signal CLK_B have a first level combination, in response to the second transmitted power-down signal PDEN1<2>.

Figure 4:
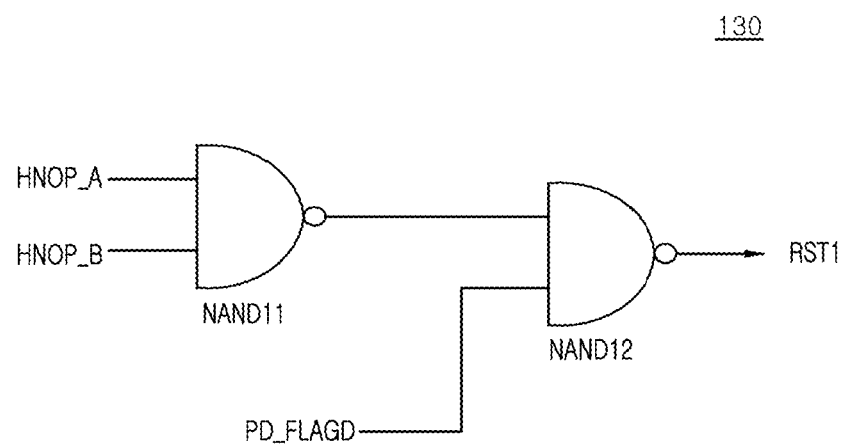
FIG. 4 is a circuit diagram illustrating an example of a reset signal generation circuit included in the first flag signal generation circuit of FIG. 2.

Referring to FIG. 4, the reset signal generation circuit 130 may be realized using logic operators, for example but not limited to, NAND gates NAND11 and NAND12.

The NAND gate NAND11 may perform a NAND operation of the first power-down end signal HNOP_A and the second power-down end signal HNOP_B to output a result of the NAND operation as an output signal thereof. The first power-down end signal HNOP_A may be a signal which is enabled to have a logic "low(L)" level if the second group of command/address signals CA<4:5> have a second level combination. The second power-down end signal HNOP_B may be a signal which is enabled to have a logic "low(L)" level if the second group of command/address signals CA<4:5> have a second level combination.

The NAND gate NAND12 may perform a NAND operation of an output signal of the NAND gate NAND11 and a delayed flag signal PD_FLAGD to output a result of the NAND operation as the first reset signal RST1. The delayed flag signal PD_FLAGD may be a signal which is generated by delaying the first flag signal FLAG1 by a predetermined period.

The reset signal generation circuit 130 having an aforementioned configuration may generate the first reset signal RST1 which is enabled to have a logic "low(L)" level according to the delayed flag signal PD_FLAGD if at least one of the first power-down end signal HNOP_A and the second power-down end signal HNOP_B is enabled.

Figure 5:
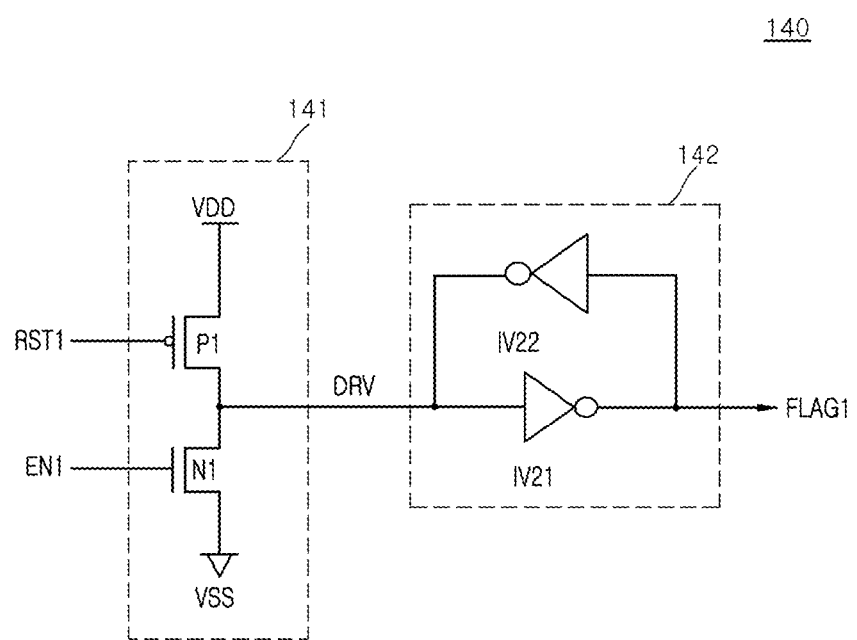
FIG. 5 is a circuit diagram illustrating an example of a flag signal output circuit included in the first flag signal generation circuit of FIG. 2.

Referring to FIG. 5, the flag signal output circuit 140 may include a drive signal generation circuit 141 and a latch circuit 142.

The drive signal generation circuit 141 may be realized using, for example but not limited to, a PMOS transistor P1 and an NMOS transistor N1 which are coupled in series between a power supply voltage VDD terminal and a ground voltage VSS terminal. The drive signal generation circuit 141 may generate a drive signal DRV having a logic "high(H)" level if the first reset signal RST1 is enabled to have a logic "low(L)" level. The drive signal generation circuit 141 may generate the drive signal DRV having a logic "low(L)" level if the first enablement signal EN1 is enabled to have a logic "high(H)" level.

The latch circuit 142 may be realized using logic operators, for example but not limited to, inverters IV21 and IV22. The latch circuit 142 may latch the drive signal DRV and may inversely buffer the latched drive signal to generate the first flag signal FLAG1.

The flag signal output circuit 140 having an aforementioned configuration may generate the first flag signal FLAG1 which is enabled in response to the first enablement signal EN1 and which is disabled in response to the first reset signal RST1.

Figure 6:
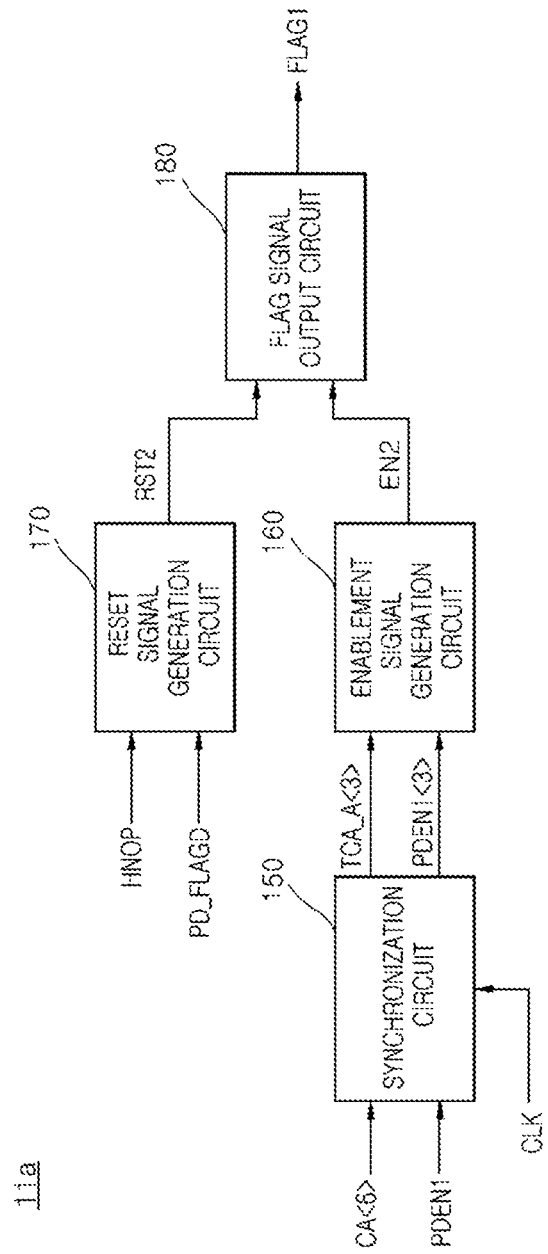
FIG. 6 is a block diagram illustrating an example of a first flag signal generation circuit included in the integrated circuit of FIG. 1.

FIG. 6 is a block diagram illustrating other examples of the first flag signal generation circuit 11 included in the integrated circuit of FIG. 1. A first flag signal generation circuit 11a corresponding to the other examples of the first flag signal generation circuit 11 may include a synchronization circuit 150, an enablement signal generation circuit 160, a reset signal generation circuit 170 and a flag signal output circuit 180.

The synchronization circuit 150 may be synchronized with a clock signal CLK to output the sixth command/address signal CA<6> as a third transmitted command/address signals TCA_A<3>. The synchronization circuit 150 may be synchronized with a rising edge of the clock signal CLK to output the sixth command/address signal CA<6> as the third transmitted command/address signal TCA_A<3>. The synchronization circuit 150 may be synchronized with the clock signal CLK to output the first power-down signal PDEN1 as a third transmitted power-down signal PDEN1<3>. The synchronization circuit 150 may be synchronized with a rising edge of the clock signal CLK to output the first power-down signal PDEN1 as the third transmitted power-down signal PDEN1<3>. The clock signal CLK may be set as any one of the first and second clock signals CLK_A and CLK_B. The clock signal CLK may be an external signal that is provided to synchronize the first and second semiconductor devices 1 and 2. The clock signal CLK may be a signal which is periodically toggled. The synchronization circuit 150 may be realized to perform substantially the same operation as the synchronization circuit 110 illustrated in FIG. 2 except that the synchronization circuit 150 receives a single clock signal while the synchronization circuit 110 receives two clock signals.

The enablement signal generation circuit 160 may generate a second enablement signal EN2 which is enabled if the third transmitted command/address signal TCA_A<3> has a predetermined level, in response to the third transmitted power-down signal PDEN1<3>. The enablement signal generation circuit 160 may generate the second enablement signal EN2 which is enabled if the third transmitted power-down signal PDEN1<3> is enabled and the third transmitted command/address signal TCA_A<3> has a predetermined level. The predetermined level of the third transmitted command/address signal TCA_A<3> means a logic "high (H)" level. The enablement signal generation circuit 160 may be realized to perform substantially the same operation as the enablement signal generation circuit 120 illustrated in FIG. 2 except that the enablement signal generation circuit 160 receives the third transmitted command/address signal TCA_A<3> and the third transmitted power-down signal PDEN1<3> as input signals while the enablement signal generation circuit 120 receives the first and second transmitted command/address signals TCA_A<1:2>, the third and fourth transmitted command/address signals TCA_B<1:2> and the first and second transmitted power-down signals PDEN1<1:2> as input signals.

The reset signal generation circuit 170 may generate a second reset signal RST2 which is enabled in response to a power-down end signal HNOP. The reset signal generation circuit 170 may generate the second reset signal RST2 which is enabled if the power-down end signal HNOP is enabled. The power-down end signal HNOP may be set as any one of the first and second power-down end signals HNOP_A and HNOP_B illustrated in FIG. 2. The reset signal generation circuit 170 may be realized to perform substantially the same operation as the reset signal generation circuit 130 illustrated in FIG. 2 except that the reset signal generation circuit 170 receives a single power-down end signal while the reset signal generation circuit 130 receives two single power-down end signals. In an embodiment, for example, the reset signal generation circuit 170 may also receive a delayed flag signal PD_FLAGD.

The flag signal output circuit 180 may generate the first flag signal FLAG1 which is enabled in response to the second enablement signal EN2 and which is disabled in response to the second reset signal RST2. The flag signal output circuit 180 may be realized to perform substantially the same operation as the flag signal output circuit 140 illustrated in FIG. 2 except that the flag signal output circuit 180 receives the second reset signal RST2 and the second enablement signal EN2 as input signals while the flag signal output circuit 140 receives the first reset signal RST1 and the first enablement signal EN1 as input signals.

Figure 7:
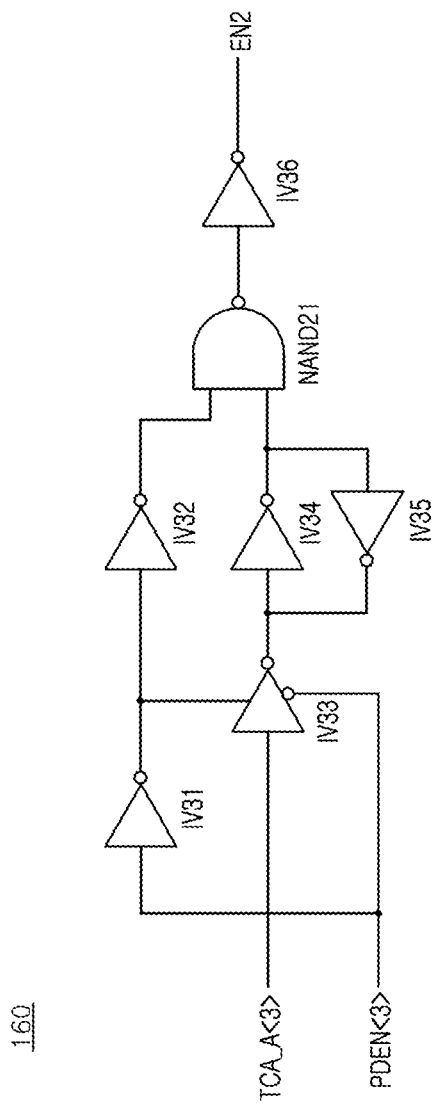
FIG. 7 is a circuit diagram illustrating an example of an enablement signal generation circuit included in the first flag signal generation circuit of FIG. 6.

Referring to FIG. 7, the enablement signal generation circuit 160 may be realized using logic operators, for example but not limited to, inverters IV31, IV32, IV33, IV34, IV35 and IV36 and a NAND gate NAND21.

The enablement signal generation circuit 160 may generate the second enablement signal EN2 which is enabled if the third transmitted command/address signal TCA_A<3> has a predetermined level, in response to the third transmitted power-down signal PDEN1<3>. The enablement signal generation circuit 160 may generate the second enablement signal EN2 which is enabled if the third transmitted command/address signal TCA_A<3> has a predetermined level and the third transmitted power-down signal PDEN1<3> is enabled. The predetermined level of the third transmitted command/address signal TCA_A<3> means a logic "high (H)" level.

Figure 8:
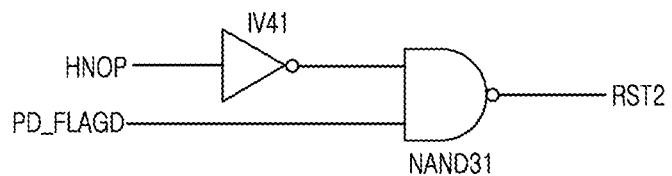
FIG. 8 is a circuit diagram illustrating an example of a reset signal generation circuit included in the first flag signal generation circuit of FIG. 6.

Referring to FIG. 8, the reset signal generation circuit 170 may be realized using logic operators, for example but not limited to, an inverter IV41 and a NAND gate NAND31.

The reset signal generation circuit 170 may perform an NAND operation of the delayed flag signal PD_FLAGD and a complementary signal of the power-down end signal HNOP to output the result of the NAND operation as the second reset signal RST2. The delayed flag signal PD_FLAGD may be a signal which is generated by delaying the first flag signal FLAG1 by a predetermined period. The reset signal generation circuit 170 may generate the second reset signal RST2 which is enabled according to the delayed flag signal PD_FLAGD if the power-down end signal HNOP is enabled to have a logic "low(L)" level.

Referring to FIG. 9, the first internal circuit 12 may include a command generation circuit 200, a memory circuit 300, a resistance value setting circuit 400 and an on-die termination (ODT) circuit 500.

The command generation circuit 200 may generate the first power-down signal PDEN1 according to a level combination of the second group of command/address signals CA<4:5> included in the first to seventh command/address signals CA<1:7>. The command generation circuit 200 may interrupt the input of the first group of command/address signals CA<1:3> included in the first to seventh command/address signals CA<1:7> in response to the first flag signal FLAG1. The command generation circuit 200 may interrupt the input of the first group of command/address signals CA<1:3> included in the first to seventh command/address signals CA<1:7> if the first flag signal FLAG1 is enabled. The command generation circuit 200 may generate termination write signals ODT_WT_A and ODT_WT_B and termination read signals ODT_RD_A and ODT_RD_B according to a level combination of the second group of command/address signals CA<4:5> included in the first to seventh command/address signals CA<1:7> if the first flag signal FLAG1 is enabled. The command generation circuit 200 may generate write signals WT_A and WT_B and read signals RD_A and RD_B according to level combinations of the first and second groups of command/address signals CA<1:3> and CA<4:5> included in the first to seventh command/address signals CA<1:7> if the first flag signal FLAG1 is disabled. The command generation circuit 200 may be synchronized with the first clock signal CLK_A to generate the termination write signal ODT_WT_A, the termination read signal ODT_RD_A, the write signal WT_A and the read signal RD_A. The command generation circuit 200 may be synchronized with the second clock signal CLK_B to generate the termination write signal ODT_WT_B, the termination read signal ODT_RD_B, the write signal WT_B and the read signal RD_B.

The memory circuit 300 may receive or output data DQ through the first pad circuit 13 in response to the write signals WT_A and WT_B or the read signals RD_A and RD_B. The memory circuit 300 may receive or output a strobe signal DQS through the first pad circuit 13 in response to the write signals WT_A and WT_B or the read signals RD_A and RD_B. The strobe signal DQS may be set as a signal for strobing the data DQ. Although FIG. 9 illustrates an example in which the memory circuit 300 receives or output the data DQ and the strobe signal DQS, the present disclosure is not limited thereto. For example, the memory circuit 300 may be realized to receives or output various signals used in the second semiconductor device 2 in addition to the data DQ and the strobe signal DQS.

The resistance value setting circuit 400 may output the first resistance signal RTT<1> which is set in response to the termination write signals ODT_WT_A and ODT_WT_B and the termination read signals ODT_RD_A and ODT_RD_B. The resistance value setting circuit 400 may be realized using a mode register set (MRS) that stores information on operations of the second semiconductor device 2. The first resistance signal RTT<1> may be a signal that controls a drivability for driving levels of the pads P included in the first and second pad circuits 13 and 23 according to resistance values of the first and second I/O lines IO1 and IO2.

The ODT circuit 500 may drive the pads P of the first pad circuit 13 with a drivability which is set according to the first resistance signal RTT<1>. The ODT circuit 500 may be realized using a general ODT circuit. The ODT circuit 500 may drive the pads P of the first pad circuit 13 with a drivability which is set according to the second resistance signal RTT<2> outputted from the second rank 20.

Figure 10:
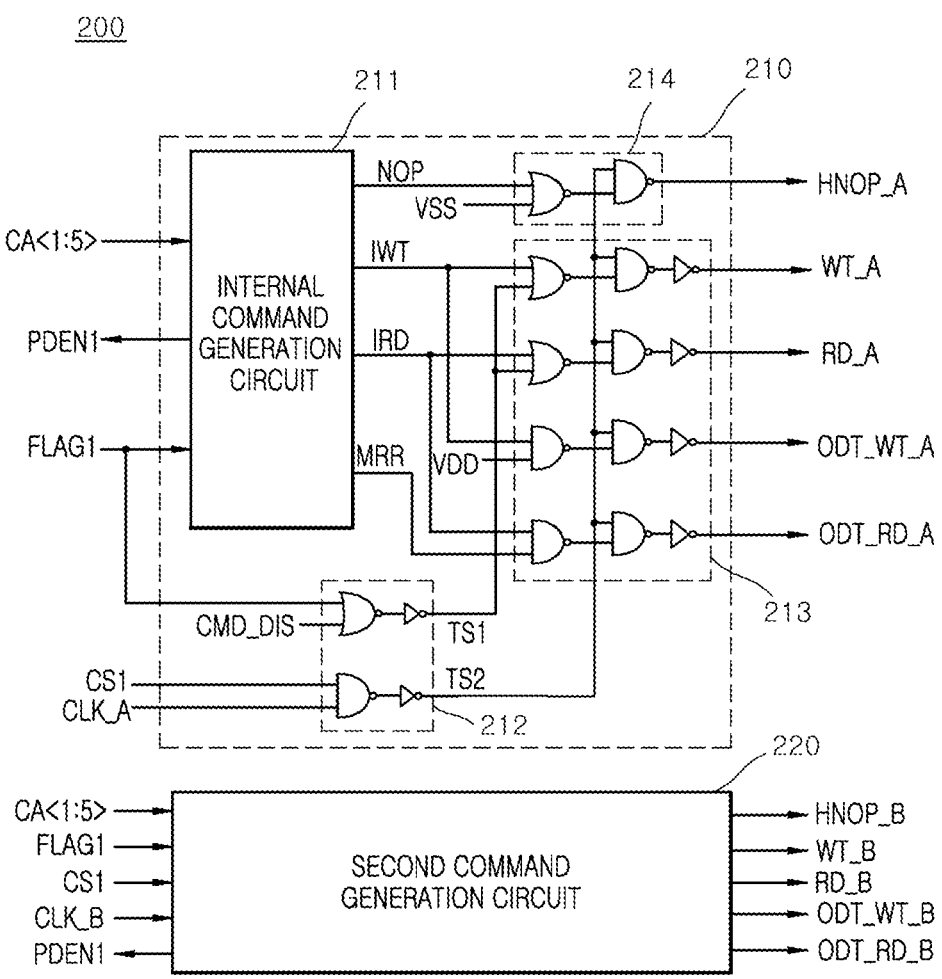
FIG. 10 is a block diagram illustrating a configuration of a command generation circuit included in the first internal circuit of FIG. 9.

Referring to FIG. 10, the command generation circuit 200 may include a first command generation circuit 210 and a second command generation circuit 220.

The first command generation circuit 210 may include an internal command generation circuit 211, a transmission signal generation circuit 212, a signal transmission circuit 213 and a power-down end signal generation circuit 214.

The internal command generation circuit 211 may generate the first power-down signal PDEN1 according to a level combination of the second group of command/address signals CA<4:5> included in the first to seventh command/address signals CA<1:7>. The internal command generation circuit 211 may generate an internal write command IWT, an internal read command IRD, a mode register read command MRR and an end command NOP from the first and second groups of command/address signals CA<1:5> in response to the first flag signal FLAG1. The internal command generation circuit 211 may interrupt the input of the first group of command/address signals CA<1:3> if the first flag signal FLAG1 is enabled. The internal command generation circuit 211 may generate the internal write command IWT, the internal read command IRD, the mode register read command MRR and the end command NOP from the second group of command/address signals CA<4:5> if the first flag signal FLAG1 is enabled. The internal command generation circuit 211 may generate the internal write command IWT, the internal read command IRD, the mode register read command MRR and the end command NOP from the first and second groups of command/address signals CA<1:5> if the first flag signal FLAG1 is disabled.

The transmission signal generation circuit 212 may generate a first transmission signal TS1 in response to the first flag signal FLAG1 and a command disablement signal CMD_DIS. The transmission signal generation circuit 212 may generate the first transmission signal TS1 which is enabled to have a logic "high(H)" level if the first flag signal FLAG1 or the command disablement signal CMD_DIS has a logic "high(H)" level. The transmission signal generation circuit 212 may be synchronized with first clock signal CLK_A to output the first chip selection signals CS1 as a second transmission signal TS2. The command disablement signal CMD_DIS may be a signal which is enabled in an idle mode of the integrated circuit and which is enabled even during a parity generation operation performed by an error correction code (ECC) circuit to correct errors of data.

The signal transmission circuit 213 may generate the write signal WT_A, the read signal RD_A, the termination write signal ODT_WT_A and the termination read signal ODT_RD_A from the internal write command IWT, the internal read command IRD and the mode register read command MRR, in response to the first and second transmission signals TS1 and TS2. The signal transmission circuit 213 may interrupt the input of the internal write command IWT to prevent generation of the write signal WT_A if the first transmission signal TS1 is enabled to have a logic "high(H)" level. The signal transmission circuit 213 may interrupt the input of the internal read command IRD to prevent generation of the read signal RD_A if the first transmission signal TS1 is enabled to have a logic "high(H)" level. The signal transmission circuit 213 may be synchronized with the second transmission signal TS2 to generate the write signal WT_A and the termination write signal ODT_WT_A from the internal write command IWT. The signal transmission circuit 213 may be synchronized with the second transmission signal TS2 to output the internal read command IRD as the read signal RD_A. The signal transmission circuit 213 may be synchronized with the second transmission signal TS2 to output the internal read command IRD as the termination read signal ODT_RD_A if the mode register read command MRR has a logic "high(H)" level.

The power-down end signal generation circuit 214 may output the end command NOP as the first power-down end signal HNOP_A in response to the ground voltage VSS and the second transmission signal TS2. The power-down end signal generation circuit 214 may be synchronized with the second transmission signal TS2 to output the end command NOP as the first power-down end signal HNOP_A.

The second command generation circuit 220 may be realized to perform substantially the same operation as the first command generation circuit 210 except that the second command generation circuit 220 receives the second clock signal CLK_B as one of input signals while the first command generation circuit 210 receives the first clock signal CLK_A as one of input signals. Thus, a detailed description of a configuration and an operation of the second command generation circuit 220 will be omitted hereinafter.

Various logic level combinations of the first to seventh command/address signals CA<1:7> for generating the termination write signal ODT_WT_A and the termination read signal ODT_RD_A in the command generation circuit 200 during the power-down operation will be described hereinafter with reference to FIG. 11.

The termination write signals ODT_WT_A and ODT_WT_B may be generated in the write operation during the power-down operation if the input of the first to third command/address signals CA<1:3> is interrupted, the fourth command/address signal CA<4> having a logic "low(L)" level is inputted, the fifth command/address signal CA<5> having a logic "low(L)" level is inputted, and the sixth and seventh command/address signals CA<6:7> having a logic "high(H)" level are inputted.

The termination read signals ODT_RD_A and ODT_RD_B may be generated in the read operation during the power-down operation if the input of the first to third command/address signals CA<1:3> is interrupted, the fourth command/address signal CA<4> having a logic "low(L)" level is inputted, the fifth command/address signal CA<5> having a logic "high(H)" level is inputted, and the sixth and seventh command/address signals CA<6:7> having a logic "high(H)" level are inputted.

The termination read signals ODT_RD_A and ODT_RD_B may be generated in the mode register read operation during the power-down operation if the input of the first to third command/address signals CA<1:3> is interrupted, the fourth command/address signal CA<4> having a logic "low(L)" level is inputted, the fifth command/address signal CA<5> having a logic "high(H)" level is inputted, and the sixth and seventh command/address signals CA<6:7> having a logic "high(H)" level are inputted.

The integrated circuit may enter a power-down entry operation during the power-down operation if the input of the first to third command/address signals CA<1:3> is interrupted, the fourth command/address signal CA<4> having a logic "high(H)" level is inputted, the fifth command/address signal CA<5> having a logic "low(L)" level is inputted, and the sixth and seventh command/address signals CA<6:7> having a logic "high(H)" level are inputted.

The integrated circuit may enter a power-down end operation during the power-down operation if the input of the first to third command/address signals CA<1:3> is interrupted, the fourth command/address signal CA<4> having a logic "high(H)" level is inputted, the fifth command/address signal CA<5> having a logic "high(H)" level is inputted, and the sixth and seventh command/address signals CA<6:7> having a logic "high(H)" level are inputted.

An operation of the integrated circuit having an aforementioned configuration will be described hereinafter in conjunction with an example in which the first rank 10 performs the ODT operation during the power-down operation and the second rank 20 performs the write operation during the power-down operation.

The first semiconductor device 1 may output the first chip selection signal CS1. The first semiconductor device 1 may output the first to seventh command/address signals CA<1:7>. In such a case, the fourth command/address signal CA<4> may have a logic "high(H)" level and the fifth command/address signal CA<5> may have a logic "low(L)" level.

The first internal circuit 12 may generate the first power-down signal PDEN1 which is enabled according to a level combination of the fourth and fifth command/address signals CA<4:5> and a logic level of the first chip selection signal CS1.

The first flag signal generation circuit 11 may generate the first flag signal FLAG1 which is enabled to have a logic "high(H)" level in response to the first power-down signal PDEN1 since the sixth and seventh command/address signals CA<6:7> have a logic "high(H)" level.

The command generation circuit 200 of the first internal circuit 12 may interrupt the input of the first group of command/address signals CA<1:3> in response to the first flag signal FLAG1 having a logic "high(H)" level. The command generation circuit 200 may generate the termination write signals ODT_WT_A and ODT_WT_B according to a level combination of the second group of command/address signals CA<4:5> in response to the first flag signal FLAG1 having a logic "high(H)" level.

The resistance value setting circuit 400 of the first internal circuit 12 may output the first resistance signal RTT<1> that is set in response to the termination write signals ODT_WT_A and ODT_WT_B. The resistance value setting circuit 400 may output the first resistance signal RTT<1> to an ODT circuit (not illustrated) of the second rank 20.

The ODT circuit 500 of the first internal circuit 12 may drive levels of the pads P included in the first pad circuit 13 with a drivability which is set according to the first resistance signal RTT<1>.

That is, the first rank 10 may perform the ODT operation during the power-down operation.

The first semiconductor device 1 may output the second chip selection signal CS2. The first semiconductor device 1 may output the first to seventh command/address signals CA<1:7>. In such a case, the first to third command/address signals CA<1:3> may have any one of various level combinations, the fourth and fifth command/address signals CA<4:5> may have a logic "low(L)" level, and the sixth and seventh command/address signals CA<6:7> may have a logic "high(H)" level.

The second internal circuit 22 may generate the second power-down signal PDEN2 which is disabled according to a level combination of the fourth and fifth command/address signals CA<4:5> and a logic level of the second chip selection signal CS2.

The second flag signal generation circuit 21 may generate the second flag signal FLAG2 which is disabled to have a logic "low(L)" level since the second power-down signal PDEN2 is disabled.

A command generation circuit (not illustrated) of the second internal circuit 22 may generate a write signal (not illustrated) according to a level combination of the first and second groups of command/address signals CA<1:5> in response to the second flag FLAG2 having a logic "low(L)" level.

A memory circuit (not illustrated) of the second internal circuit 22 may store data DQ which are inputted through the pads P of the second pad circuit 23 and the second I/O line IO2, in response to a write signal (not illustrated) outputted from a command generation circuit (not illustrated) of the second internal circuit 22.

In such a case, an ODT circuit (not illustrated) of the second internal circuit 22 may prevent signals loaded on the second I/O line IO2 from being reflected and distorted, in response to the first resistance signal RTT<1> outputted from the first rank 10. As a result, the reliability of the signals may be improved.

That is, the second rank 20 may perform the write operation during the power-down operation.

As described above, an integrated circuit according to an embodiment may selectively perform the ODT operation during the power-down operation by the ranks according to a level combination of a specific group of the command/address signals.

Figure 12:
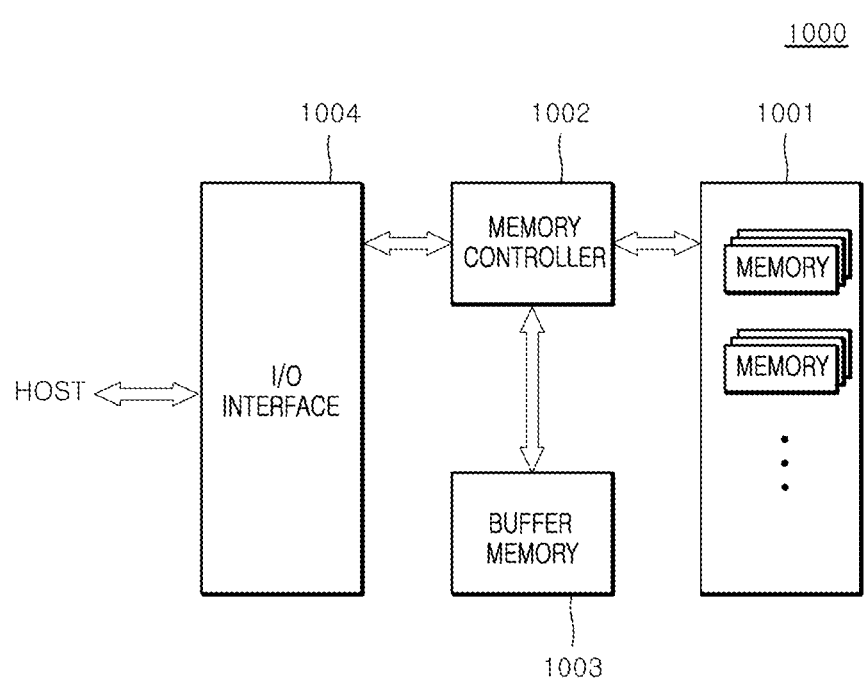
FIG. 12 is a block diagram illustrating a configuration of an electronic system employing the integrated circuit illustrated in FIGS. 1 to 11.

The integrated circuits described with reference to FIGS. 1 to 11 may be applied to an electronic system that includes a memory system, a graphic system, a computing system, a mobile system, or the like. For example, as illustrated in FIG. 12, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include the second semiconductor device 2 illustrated in FIG. 1. The data storage circuit 1001 may generate internal data having a logic level which is internally set regardless of logic levels of external data and may perform an initialization operation that stores the internal data in a memory cell array included in the data storage circuit 1001. Meanwhile, the data storage circuit 1001 may include an ODT circuit (not illustrated) for preventing distortion of data. The ODT circuit may be designed not to operate during the initialization operation of the data storage circuit 1001. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may include the first semiconductor device 1 illustrated in FIG. 1. The memory controller 1002 may apply data and a strobe signal for strobing the data to the data storage circuit 1001. The strobe signal outputted from the memory controller 1002 may not be toggled during the initialization operation and may be toggled after the initialization operation terminates. Although FIG. 12 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data from the external device (i.e., the host) through the I/O interface 1004 and may output the data generated by the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:
1. An integrated circuit comprising:
a first semiconductor device configured to output a chip selection signal and command and address (command/address) signals; and
a second semiconductor device configured to enter a power-down operation based on the chip selection signal and the command/address signals, configured to interrupt input of a first group of the command/address signals during the power-down operation, and configured to selectively perform an on-die termination (ODT) operation according to a level combination of a second group of the command/address signals.
2. The integrated circuit of claim 1,
wherein the second semiconductor device performs the ODT operation during the power-down operation if the second group of the command/address signals has a first level combination; and wherein the second semiconductor device does not perform the ODT operation if a level combination of the second group of the command/address signals is different from the first level combination.

3. The integrated circuit of claim 1, wherein the second semiconductor device enters the power-down operation if a third group of the command/address signals has a second level combination; and wherein the second semiconductor device ends the power-down operation if the third group of the command/address signals has a third level combination.

4. The integrated circuit of claim 1, wherein the second semiconductor device includes:

a flag signal generation circuit configured to generate a flag signal which is enabled if the second group of the command/address signals has a first level combination, based on a power-down signal; and an internal circuit configured to enter the power-down operation based on the chip section signal and the flag signal, configured to interrupt input of the first group of the command/address signals during the power-down operation, and configured to perform the ODT operation according to a level combination of the second group of the command/address signals to drive levels of pads so that an equivalent resistance value at each of the pads exhibits a predetermined resistance value.

5. The integrated circuit of claim 4, wherein the flag signal generation circuit includes:

an enablement signal generation circuit configured to generate an enablement signal which is enabled if transmitted command/address signals generated from the second group of the command/address signals in synchronization with a clock signal based on a transmitted power-down signal having the first level combination;

a reset signal generation circuit configured to generate a reset signal which is enabled based on a power-down end signal which is enabled if a third group of the command/address signals has a third level combination; and a flag signal output circuit configured to generate the flag signal which is enabled based on the enablement signal and which is disabled based on the reset signal.

6. The integrated circuit of claim 5, wherein the flag signal generation circuit includes:

a synchronization circuit configured to output the second group of the command/address signals in synchronization with the clock signal to the enablement signal generation circuit and output a power-down signal as the transmitted power-down signal in synchronization with the clock signal to the enablement signal generation circuit.

7. The integrated circuit of claim 4, wherein the internal circuit includes:

a command generation circuit configured to interrupt input of the first group of the command/address signals based on the flag signal and configured to generate the power-down signal, a termination write signal and a termination read signal according to a level combination of the second group of the command/address signals and a third group of the command/address signals;

a resistance value setting circuit configured to output a resistance signal corresponding to a resistance value which is set based on the termination write signal and the termination read signal; and an ODT circuit configured to drive levels of the pads with a drivability which is set according to the resistance signal.

8. The integrated circuit of claim 7, wherein the command generation circuit generates a power-down end signal which is enabled if the third group of the command/address signals has a third level combination.

9. The integrated circuit of claim 7, wherein the resistance value is set by a mode register set (MRS) to control the drivability for driving the pads according to a resistance of an input and output (input/output) (I/O) line.

10. An integrated circuit comprising:

a first semiconductor device configured to output first and second chip selection signals and command and address (command/address) signals; and a second semiconductor device configured to include a first rank and a second rank, wherein the first rank performs an on-die termination (ODT) operation according to a level combination of a first group of the command/address signals based on the first chip selection signal, and the second rank performs a normal operation according to a level combination of the first group of the command/address signals based on the second chip selection signal.

11. The integrated circuit of claim 10, wherein the first and second ranks share the command/address signals.

12. The integrated circuit of claim 10, wherein the first rank enters a power-down operation based on the first chip selection signal and the command/address signals;

wherein the first rank interrupts input of a second group of the command/address signals during the power-down operation; and wherein the first rank ends the power-down operation according to a level combination of a third group of the command/address signals during the power-down operation.

13. The integrated circuit of claim 10, wherein the first rank performs the ODT operation if the first group of the command/address signals has a first level combination during a power-down operation; and wherein the first rank does not perform the ODT operation if a level combination of the first group of the command/address signals is different from the first level combination.

14. The integrated circuit of claim 10, wherein the first rank enters a power-down operation if a third group of the command/address signals has a second level combination; and wherein the first rank ends the power-down operation if the third group of the command/address signals has a third level combination during the power-down operation.

15. The integrated circuit of claim 10, wherein the second rank receives second and third groups of the command/address signals to perform a normal operation, based on the second chip selection signal.

16. The integrated circuit of claim 10, wherein the first rank includes:

a first flag signal generation circuit configured to generate a first flag signal which is enabled if the first group of the command/address signals has a first level combination, based on a first power-down signal; and a first internal circuit configured to enter a power-down operation based on the first chip section signal and the first flag signal, configured to interrupt input of a second group of the command/address signals during the power-down operation, and configured to perform the ODT operation according to a level combination of a third group of the command/address signals to drive levels of first pads of a first pad circuit so that an equivalent resistance value at each of the first pads exhibits a predetermined resistance value.

17. The integrated circuit of claim 16, wherein the first flag signal generation circuit includes:
   a first enablement signal generation circuit configured to generate a first enablement signal which is enabled if first transmitted command/address signals generated from the first group of the command/address signals in synchronization with a clock signal based on a first transmitted power-down signal have the first level combination;
   a first reset signal generation circuit configured to generate a first reset signal which is enabled based on a first power-down end signal which is enabled if the third group of the command/address signals has a third level combination; and
   a first flag signal output circuit configured to generate the first flag signal which is enabled based on the first enablement signal and which is disabled based on the first reset signal.

18. The integrated circuit of claim 17, wherein the first flag signal generation circuit includes:
   a first synchronization circuit configured to output the first group of the command/address signals in synchronization with the clock signal to the first enablement signal generation circuit and output a first power-down signal as the first transmitted power-down signal in synchronization with the clock signal to the first enablement signal generation circuit.

19. The integrated circuit of claim 16, wherein the first internal circuit includes:
   a first command generation circuit configured to interrupt input of the second group of the command/address signals based on the first flag signal and configured to generate the first power-down signal, a termination write signal and a termination read signal according to a level combination of the first and third groups of the command/address signals;
   a resistance value setting circuit configured to output a resistance signal corresponding to a resistance value which is set based on the termination write signal and the termination read signal; and
   an ODT circuit configured to drive the first pad circuit with a drivability which is set according to the resistance signal.

20. The integrated circuit of claim 10, wherein the second rank includes:

a second flag signal generation circuit configured to generate a second flag signal which is enabled if the first group of the command/address signals has a first level combination, based on a second power-down signal; and
   a second internal circuit configured to enter the normal operation based on the second chip section signal and the second flag signal, configured to generate a write signal and a read signal for the normal operation from second and third groups of the command/address signals during the normal operation, and configured to receive or output data through a second pad circuit.

21. The integrated circuit of claim 20, wherein the second flag signal generation circuit includes:
   a second enablement signal generation circuit configured to generate a second enablement signal which is enabled if second transmitted command/address signals generated from the first group of the command/address signals in synchronization with a clock signal based on a second transmitted power-down signal have the first level combination;
   a second reset signal generation circuit configured to generate a second reset signal which is enabled based on a second power-down end signal which is enabled if the third group of the command/address signals has a third level combination; and
   a second flag signal output circuit configured to generate the second flag signal which is enabled based on the second enablement signal and which is disabled based on the second reset signal.

22. The integrated circuit of claim 20, wherein the second flag signal generation circuit includes:
   a second synchronization circuit configured to output the first group of the command/address signals in synchronization with the clock signal to the second enablement signal generation circuit and output a second power-down signal as the second transmitted power-down signal in synchronization with the clock signal to the second enablement signal generation circuit.

23. The integrated circuit of claim 20, wherein the second internal circuit includes:
   a second command generation circuit configured to generate the second power-down signal from the second group of the command/address signals and configured to generate the write signal and the read signal from the second and third groups of the command/address signals based on the second flag signal; and
   a memory circuit configured to receive or output data through a second pad circuit based on the write signal and the read signal.

\* \* \* \* \*